United States Patent
Kondou et al.

(10) Patent No.: US 8,154,123 B2
(45) Date of Patent: Apr. 10, 2012

(54) SOLDER BUMP, SEMICONDUCTOR CHIP, METHOD OF MANUFACTURING THE SEMICONDUCTOR CHIP, CONDUCTIVE CONNECTION STRUCTURE, AND METHOD OF MANUFACTURING THE CONDUCTIVE CONNECTION STRUCTURE

(75) Inventors: Shigeru Kondou, Osaka (JP); Yoshihiro Tomura, Osaka (JP)

(73) Assignee: Panasonic Corporation, Osaka (JP)

( * ) Notice: Subject to any disclaimer, the term of this patent is extended or adjusted under 35 U.S.C. 154(b) by 277 days.

(21) Appl. No.: 12/707,872

(22) Filed: Feb. 18, 2010

(65) Prior Publication Data

US 2010/0213609 A1 Aug. 26, 2010

(30) Foreign Application Priority Data

Feb. 20, 2009 (JP) ................................ 2009-037258
Feb. 12, 2010 (JP) ................................ 2010-028342

(51) Int. Cl.
*H01L 23/48* (2006.01)
*H01L 23/52* (2006.01)
*H01L 29/40* (2006.01)

(52) U.S. Cl. ......... 257/737; 257/778; 438/106; 438/127

(58) Field of Classification Search ................ 257/737, 257/778; 438/106, 127
See application file for complete search history.

(56) References Cited

U.S. PATENT DOCUMENTS

| 6,030,854 A * | 2/2000 | Mashimoto et al. | .......... 438/106 |
|---|---|---|---|
| 6,049,038 A | 4/2000 | Suzuki | |
| 7,656,042 B2 * | 2/2010 | Lii et al. | .......... 257/778 |
| 2003/0049411 A1 | 3/2003 | Chaudhuri et al. | |
| 2007/0238220 A1 * | 10/2007 | Lii et al. | .......... 438/106 |
| 2008/0203138 A1 | 8/2008 | Ishikawa et al. | |
| 2009/0008776 A1 | 1/2009 | Kitae et al. | |
| 2009/0246474 A1 * | 10/2009 | Sakurai et al. | .......... 428/172 |
| 2010/0059244 A1 * | 3/2010 | Ishii | .......... 174/50.5 |
| 2010/0093135 A1 * | 4/2010 | Lii et al. | .......... 438/127 |

FOREIGN PATENT DOCUMENTS

| JP | 09-266229 | 10/1997 |
|---|---|---|
| JP | 11-087424 | 3/1999 |
| JP | 2000-332056 | 11/2000 |
| JP | 2008-091650 | 4/2008 |
| JP | 2008-135518 | 6/2008 |
| JP | 2008-218528 | 9/2008 |
| WO | 2007/099866 | 9/2007 |

* cited by examiner

*Primary Examiner* — Fernando L Toledo
(74) *Attorney, Agent, or Firm* — Hamre, Schumann, Mueller & Larson, P.C.

(57) ABSTRACT

A solder bump and a conductive connection structure are provided which can conductively connect a semiconductor chip and a substrate with high connection reliability. Filler 5 is contained in a solder bump 6 and a solder joint 17 which connect a connection electrode 3 of a semiconductor chip 2 and a substrate 11, and the filler has a larger density on the side of the connection electrode 3 than on the side of the substrate 11 in the solder joint 17. Therefore, in the cooling solidification of solder, the shrinkage of the solder joint 17 near the connection electrode 3 of the semiconductor chip 2 is reduced by the filler 5 and the occurrence of a stress is reduced on the peripheral portion of the connection electrode 3, thereby preventing the occurrence of cracks near the joint.

13 Claims, 10 Drawing Sheets

PRIOR ART

US 8,154,123 B2

SOLDER BUMP, SEMICONDUCTOR CHIP, METHOD OF MANUFACTURING THE SEMICONDUCTOR CHIP, CONDUCTIVE CONNECTION STRUCTURE, AND METHOD OF MANUFACTURING THE CONDUCTIVE CONNECTION STRUCTURE

FIELD OF THE INVENTION

The present invention relates to a solder bump for connecting a semiconductor chip and a substrate, the semiconductor chip having the solder bump, a method of manufacturing the semiconductor chip, a conductive connection structure, and a method of manufacturing the conductive connection structure.

BACKGROUND OF THE INVENTION

As a method of mounting a semiconductor chip on the mounting electrodes of a substrate having a wiring pattern formed thereon, a method is known in which solder bumps and solder precoating are applied beforehand on the semiconductor chip and the electrodes of the substrate and these solder portions (that is, the solder bumps and the solder precoating) are connected to each other, so that the semiconductor chip and the substrate are electrically and physically connected to each other. For the connection of solder, flux has been generally used. However, because of a finer connection pitch in recent years, particularly, a connection pitch smaller than 150 μm, it has been difficult to clean flux. Thus the mainstream of the connection of solder portions is to heat and melt solder without using flux after the semiconductor chip and the electrodes of the substrate are aligned with each other. After the connection of the solder portions, underfill resin is applied between the semiconductor chip and the substrate to reinforce solder joints and achieve reliability, and then the underfill resin is cured by heating, so that the mounting operation is completed.

In the foregoing connection method, however, when the solder joints melted during the connection are cooled thereafter, a shrinkage stress occurs due to variations in degree of shrinkage among members. Particularly, the stress is considerably concentrated on the outer portions of the connection electrodes of the semiconductor chip, so that cracks may occur on the connection electrodes of the semiconductor chip and the solder joints formed by melting the solder bumps, which has been a problem.

Figure 11:
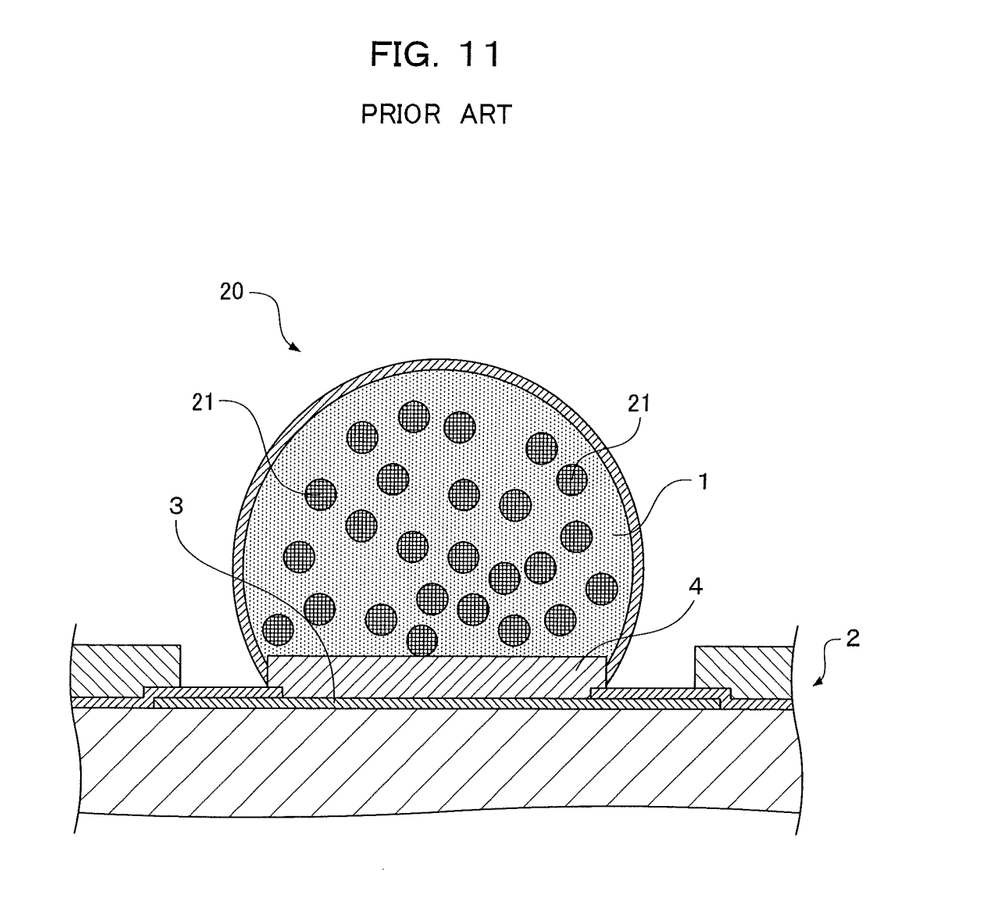
FIG. 11 is a sectional view showing a semiconductor chip on which a solder bump containing resin particles is formed according to the prior art.

As a solution to this problem according to the prior art, a method of reducing a stress by containing resin particles in the solder (solder material) of solder bumps is available (for example, see Japanese Patent Laid-Open No. 2005-108871). FIG. 11 shows the structure of a solder bump of the prior art described in Japanese Patent Laid-Open No. 2005-108871. Reference numeral 20 denotes a solder bump, reference numeral 1 denotes the solder (solder material) of the solder bump 20, reference numeral 2 denotes a semiconductor chip, reference numeral 3 denotes the connection electrode of the semiconductor chip 2, and reference numeral 21 denotes resin particles. As shown in FIG. 11, the resin particles 21 are contained in the solder 1 of the solder bump 20 so as to be substantially evenly dispersed. The elasticity of the resin particles 21 reduces a stress occurring during cooling.

DISCLOSURE OF THE INVENTION

In the configuration of the solder bump 20 of the prior art, however, the resin particles 21 are substantially evenly dispersed in the solder 1 of the solder bump 20, so that it is not possible to sufficiently reduce a stress occurring on the outer portion of the connection electrode 3 of the semiconductor chip 2, the outer portion having the highest stress concentration (in FIG. 11, an under bump metal 4 is formed on the connection electrode 3 and in this case, the stress concentrates on the outer portion of the under bump metal 4).

The present invention has been devised to solve the foregoing problem in view of present circumstances. An object of the present invention is to provide a solder bump which can conductively connect a semiconductor chip and a substrate with high connection reliability, the semiconductor chip having the solder bump, a method of manufacturing the semiconductor chip, a conductive connection structure, and a method of manufacturing the conductive connection structure.

In order to attain the object, a solder bump of the present invention is a solder bump provided on the connection electrode of a semiconductor chip to connect the connection electrode of the semiconductor chip and a substrate, wherein the solder bump contains filler having a lower thermal expansion coefficient than the solder of the solder bump, and the filler has a higher density on the end of the solder bump than on the base of the solder bump.

Preferably, the filler has a porous surface. With the porous surface of the filler, an oxide film frequently generated on the surface of the solder can be more satisfactorily broken by the filler during the joining of the solder, achieving a satisfactory joint. Preferably, the filler has a linear expansion coefficient of $0.1 \times 10^{-6}/°C.$ to $11 \times 10^{-6}/°C.$ and a specific gravity of $1.0$ g/cm$^3$ to $6.0$ g/cm$^3$.

The semiconductor chip of the present invention has the solder bump. Further, the solder bump is provided on the connection electrode of the semiconductor chip via an under bump metal, the under bump metal has a step formed thereon, and the base of the solder bump is provided so as to contain the step. With this configuration, the step is formed on the under bump metal provided on the connection electrode of the semiconductor chip and thus the filler is segregated intensively on the step where the under bump metal and the solder bump are joined to each other, so that stress concentration can be effectively reduced to prevent the occurrence of cracks.

A method of manufacturing the semiconductor chip having the solder bump according to the present invention includes the steps of: forming the solder bump containing the filler on the semiconductor chip; and melting the solder containing the filler, wherein in the melting step, the semiconductor chip is vibrated to segregate the filler in the solder bump in a state in which the solder bump is disposed on the semiconductor chip. According to this method, the filler having a low specific gravity can be satisfactorily segregated on the end of the solder bump by vibrating the semiconductor chip.

A conductive connection structure of the present invention has a solder joint formed by joining a solder bump provided on the connection electrode of a semiconductor chip and a solder portion provided on a substrate, the semiconductor chip being mounted on the substrate via the solder joint, wherein the solder joint contains filler having a lower thermal expansion coefficient than the solder of the solder joint, and the filler has a larger density on the side of the connection electrode than on the side of the substrate in the solder joint. Preferably, the density of the filler is a volume ratio of 20% to 50% on the side of the connection electrode in the solder joint. More preferably, the density of the filler is a volume ratio of 35% to 50% on the side of the connection electrode in the solder joint.

With this configuration, in the solder joint, a solder material on the side of the connection electrode is partially replaced with the filler having a low thermal expansion coefficient. Thus in the cooling solidification of the solder, a shrinkage on the side of the connection electrode in the solder joint is reduced by the filler, thereby preventing cracks on the joint of the solder joint and the connection electrode of the semiconductor chip.

Moreover, the solder joint is connected to the connection electrode of the semiconductor chip via an under bump metal, the under bump metal has a step formed thereon, and the solder joint has a portion connected to the under bump metal so as to contain the step. With this configuration, the step is formed on the under bump metal provided on the connection electrode of the semiconductor chip and thus the filler is segregated intensively on the step where the under bump metal and the solder joint are joined to each other, so that stress concentration can be effectively reduced to prevent the occurrence of cracks.

A method of manufacturing the conductive connection structure according to the present invention includes the steps of: placing the semiconductor chip in contact with a predetermined position of the substrate; and melting the solder bump of the semiconductor chip, wherein in the melting step, one of the substrate and the semiconductor chip is vibrated in a state in which the semiconductor chip is disposed on the substrate, so that the filler is segregated in the solder bump to form the solder joint. According to this method, by vibrating one of the substrate and the semiconductor chip, the filler having a low specific gravity can be satisfactorily segregated at a point on the side of the connection electrode of the solder joint.

By using the solder bump, the semiconductor chip having the solder bump, and the conductive connection structure of the present invention, it is possible to prevent cracks on the joint of the semiconductor chip and the substrate and further improve the reliability of the conductive connection structure.

DESCRIPTION OF THE EMBODIMENTS

The following will describe embodiments of the present invention with reference to the accompanying drawings.
(First Embodiment)

Figure 1:
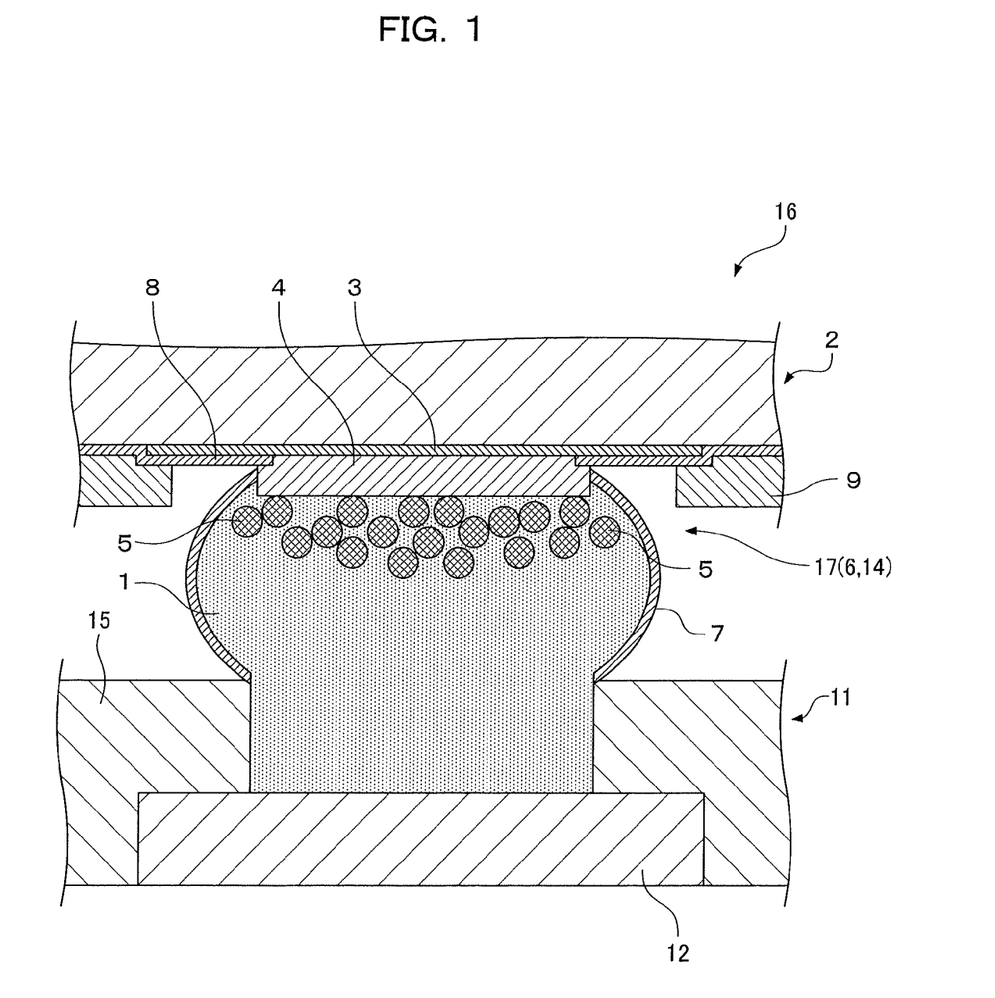
FIG. 1 is a sectional view showing a conductive connection structure (a conductive connection structure formed by connecting a semiconductor chip and a substrate by using a solder bump (solder joint) containing filler) according to a first embodiment of the present invention (after the cooling of solder)
Figure 2:
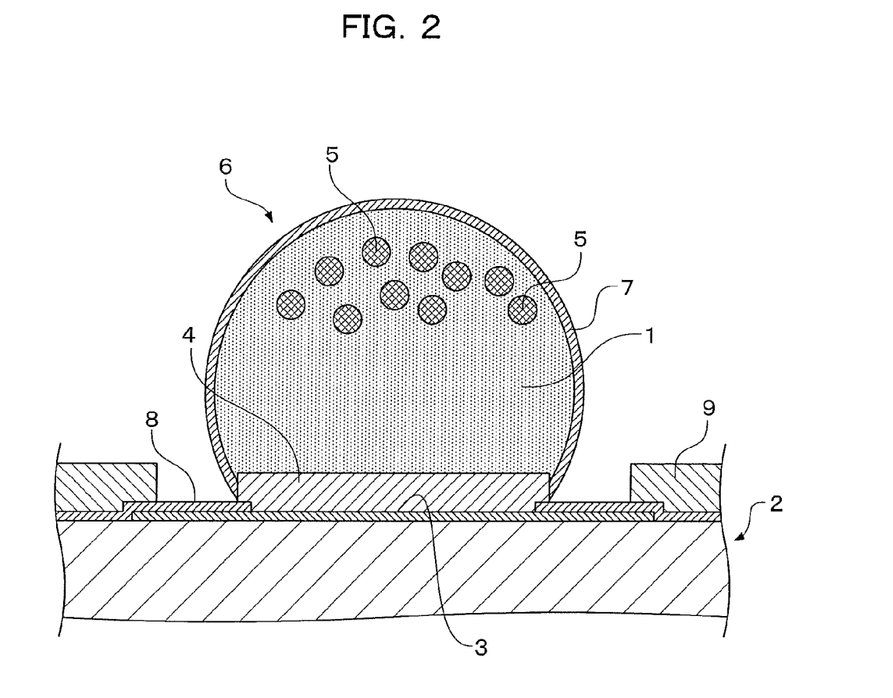
FIG. 2 is a sectional view showing the semiconductor chip on which the solder bump containing the filler is formed according to the first embodiment.

FIGS. 1 and 2 are sectional views showing a solder joint and a solder bump according to a first embodiment of the present invention. In FIGS. 1 and 2, the same constituent elements as the solder bump 20 of the prior art shown in FIG. 11 will be indicated by the same reference numerals.

As shown in FIG. 2, a solder bump 6 of the present invention connects a connection electrode 3 of a semiconductor chip 2 and a substrate 11 and contains fine filler 5. Further, on the end of the solder bump 6, that is, a point located on the solder bump 6 so as to be away from the connection electrode 3, the filler density is higher than that of the base of the solder bump 6, that is, a point located on the solder bump 6 so as to be close to the connection electrode 3 of the semiconductor chip 2. In this configuration, the filler 5 has a lower thermal expansion coefficient than solder (solder material) 1 of the solder bump 6 and solder (solder material) 1 of solder precoating 14, which will be described later. As shown in FIG. 1, the solder bump 6 formed on the semiconductor chip 2 and the solder precoating 14 serving as a solder portion formed on a substrate electrode 12 of the substrate 11 are joined to each other, so that a conductive connection structure 16 is formed (manufactured) by connecting the semiconductor chip 2 and the substrate 11 via a solder joint 17 of the solder bump 6 and the solder precoating 14. The solder bump 6 contains the filler 5 having a lower thermal expansion coefficient than the solder 1 of the solder joint 17, and the density of the filler 5 on the side of the connection electrode 3 is higher than the density of the filler on the side of the substrate 11 in the solder joint 17.

Referring to FIGS. 2 to 6, the following will sequentially describe a state of formation of the solder bump 6 on the semiconductor chip 2 and a state of formation of the solder precoating 14 on the substrate 11 before the semiconductor chip 2 and the substrate 11 are joined to each other, and further describe the forming (manufacturing) process of the conductive connection structure 16 formed by joining the semiconductor chip 2 and the substrate 11.

FIG. 2 is a sectional view showing a state of formation of the solder bump 6 on the semiconductor chip 2 before the semiconductor chip 2 and the substrate 11 are joined to each other. As shown in FIG. 2, on the semiconductor chip 2, the typical connection electrode 3 is formed at an interval of 120 μm. Further, on the connection electrode 3, an under bump metal (hereinafter called UBM) 4 composed mainly of nickel is formed, and the solder bump 6 made up of the solder 1 containing the fine filler 5 is formed thereon. In the present embodiment, the UBM 4 made of nickel is formed on the aluminum connection electrode 3 by electroless plating. Moreover, the solder 1 of the solder bump 6 is made of Sn-3Ag-0.5Cu. In order to secure bonding strength while avoiding a short circuit on the bump upon joining, the diameters of the UBM 4 and the solder bump 6 are set at 60 μm and the height of the solder bump 6 is set at 30 μm.

The material of the filler 5 contained in the solder bump 6 has a lower specific gravity and a lower thermal expansion coefficient (a linear expansion coefficient) than the solder 1.

The material of the filler 5 includes silica, alumina, silicon carbide, silicon nitride, zirconia, and mica. Particularly, silica is preferably used which has a low specific gravity of 2.0 g/cm$^3$ and an extremely low linear expansion coefficient of 0.5×10$^{-6}$/° C. In the present embodiment, the filler 5 is made of porous silica having a diameter of 0.5 μm and a surface area of 7 m$^2$/g. In this case, the filler 5 preferably has a linear expansion coefficient of 0.1×10$^{-6}$/° C. to 11×10$^{-6}$/° C. and a specific gravity of 1.0 g/cm$^3$ to 6.0 g/cm$^3$. In FIG. 2, reference numeral 7 denotes an oxide film formed on the surface of the solder 1, reference numeral 8 denotes a passivation film formed on the semiconductor chip 2, and reference numeral 9 denotes a resin layer made of polybenzoxazole (PBO) and the like.

In the forming process (manufacturing process) of the solder bump 6, solder paste containing the filler 5 is printed beforehand with a mask on a semiconductor wafer on which the many semiconductor chips 2 have been formed. After that, the solder 1 is melted by applying heat with a batch-type reflow device, and then the solder 1 is cooled.

The supplying method of the solder 1 is not limited to the foregoing method. For example, a plating solution may be mixed with the filler 5 and supplied by plating, or solder balls containing the filler 5 may be mounted and supplied by a solder ball mounting device. Further, the filler 5 may be supplied later such that flux containing the filler 5 is applied, heated, and combined after the formation of the solder bump 6.

When the solder 1 is melted, the solder 1 is vibrated mainly in the horizontal direction in order to float the filler 5, which is contained in the solder 1 with a low specific gravity, up to the top surface of the solder bump 6 in a state in which the solder bump 6 is disposed on the semiconductor chip 2. To be specific, since the solder 1 of Sn-3Ag-0.5Cu melts at around 220° C., the maximum temperature of the solder 1 was set at 250±5° C. in 10±3 sec during the melting of the solder 1, and the semiconductor chip 2 was vibrated at 100 KHz with a width of 5 μm until the solder 1 reached the maximum temperature. Consequently, the filler 5 having a lower specific gravity than the solder 1 of the solder bump 6 floated in the solder 1 and gathered on the end (upper layer) of the solder bump 6.

According to the method of manufacturing the semiconductor chip 2 having the solder bump 6, the filler 5 is not segregated over the solder bump 6 but can be segregated only on the end (upper layer) of the solder bump 6. In the present embodiment, the content of the filler 5 is adjusted such that the filler 5 can be segregated in the 5-μm end (upper layer) of the solder bump 6 with a volume ratio of 10% to 25% relative to the solder 1. Vibrations applied to the semiconductor chip 2 during the melting of the solder 1 accelerate the movement of the filler 5 to the end of the solder bump 6. Even when the semiconductor chip 2 is not vibrated in the horizontal direction, it is possible to obtain the effect of accelerating the movement. However, horizontal vibrations facilitate the upward movement of the filler 5, so that the filler 5 can efficiently gather on the end (upper layer) of the solder bump 6 in a short time.

The semiconductor wafer, on which the many semiconductor chips 2 are formed thus with the solder bumps 6 containing the filler 5, is laminated and divided into pieces as in a typical process. In this way, the semiconductor chip 2 is formed such that the solder bumps 6 containing the filler 5 are provided on the surfaces of the connection electrodes 3.

Figure 3:
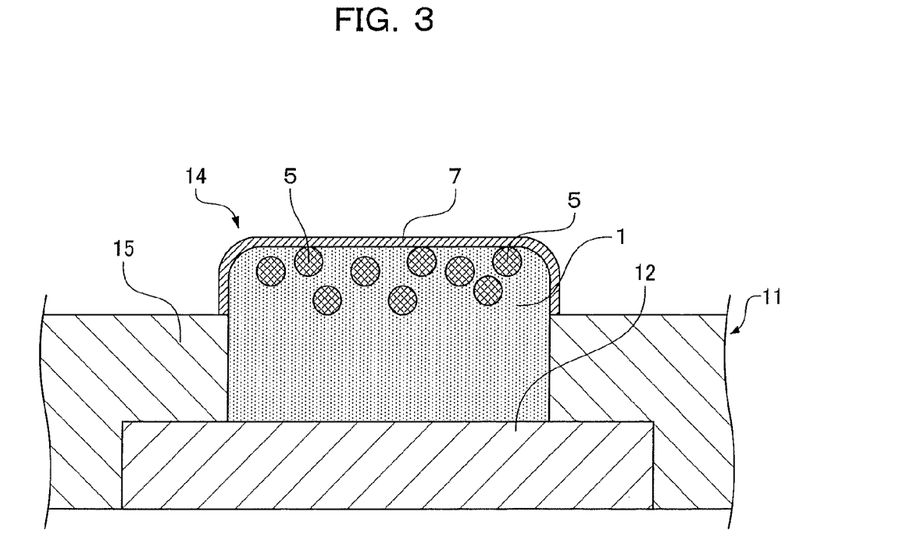
FIG. 3 is a sectional view of an SOP containing filler according to the first embodiment of the present invention.

FIG. 3 shows the substrate 11 on which the solder precoating (hereinafter called SOP) 14 is formed as an example of a solder portion. The substrate (wiring board) 11 is a build-up substrate. The substrate 11 is not limited to a build-up substrate and thus the substrate 11 may be, for example, a silicon interposer or a typical resin substrate in view of the bonding pitch and cost. As on the semiconductor chip 2, the substrate electrode 12 is formed on the substrate 11 so as to be opposed to the connection electrode 3 of the semiconductor chip 2. In FIG. 3, reference numeral 15 denotes the solder resist of the substrate 11.

Generally, in the connection using the solder bump 6, the solder precoating 14 is provided also on the substrate electrode 12. As shown in FIG. 3, in the present embodiment, the SOP 14 made up of the solder 1 containing the filler 5 is formed on the substrate 11 like the solder bump 6 of the semiconductor chip 2. The solder resist 15 of the substrate 11 has an opening diameter of 60 μm and a thickness of 35 μm. The SOP 14 is formed to protrude from the surface of the solder resist 15 by 15±5 μm. The solder 1 of the SOP 14 is made of Sn-3Ag-0.5Cu as the solder bump 6 on the side of the semiconductor chip 2.

The SOP 14 can be formed by the same method as the solder bump 6. The forming method is not always limited to the same method. In this case, solder paste containing the filler 5 was printed beforehand with a mask on the substrate 11 and then was heated by a batch-type reflow device to melt the solder 1. After that, the solder 1 was cooled and then was leveled by rolling to suppress variations in height in the substrate. In the formation of the SOP 14, the same layout and configuration as the formation of the solder bump 6 on the semiconductor chip 2 are applied (the solder precoating 14 is disposed above the substrate electrode 12 of the substrate 11) and the same heating and horizontal amplitude conditions are applied as the formation of the solder bump 6, so that the fine filler 5 is segregated on the end (upper layer) of the SOP 14.

Next, the semiconductor chip 2 formed thus is flip-chip mounted on the substrate 11. In this case, because of a small bonding pitch of 120 μm, fluxless solder bonding was used to avoid the difficulty in flux cleaning.

Figure 4:
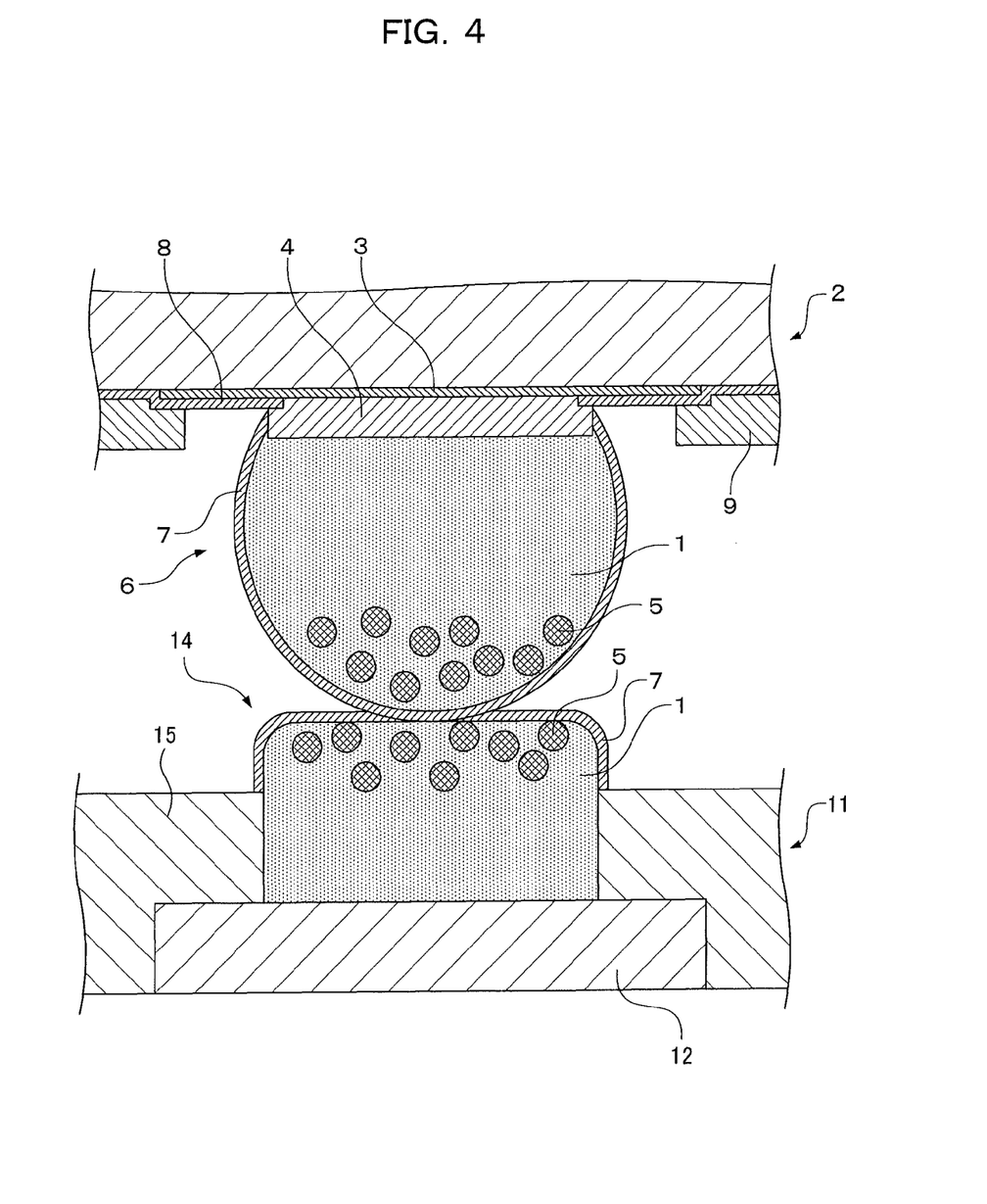
FIG. 4 is a sectional view showing the conductive connection structure before the melting of the solder according to the first embodiment of the present invention.

First, as shown in FIG. 4, the semiconductor chip 2 was placed above the substrate 11 to mount the semiconductor chip 2 on the substrate 11. The temperatures of a suction tool and a stage on the side of the semiconductor chip 2 were set such that the semiconductor chip 2 has a temperature of 200° C. and the substrate 11 has a temperature of 100° C., and then the semiconductor chip 2 was mounted such that the connection electrode 3 of the semiconductor chip 2 and the substrate electrode 12 of the substrate 11 were opposed to each other. At this point, the solder 1 of the solder bump 6 and the solder 1 of the SOP 14 did not melt and the semiconductor chip 2 was mounted with a load of about 1 g for each bump in consideration of damage to the semiconductor chip 2.

Figure 5:
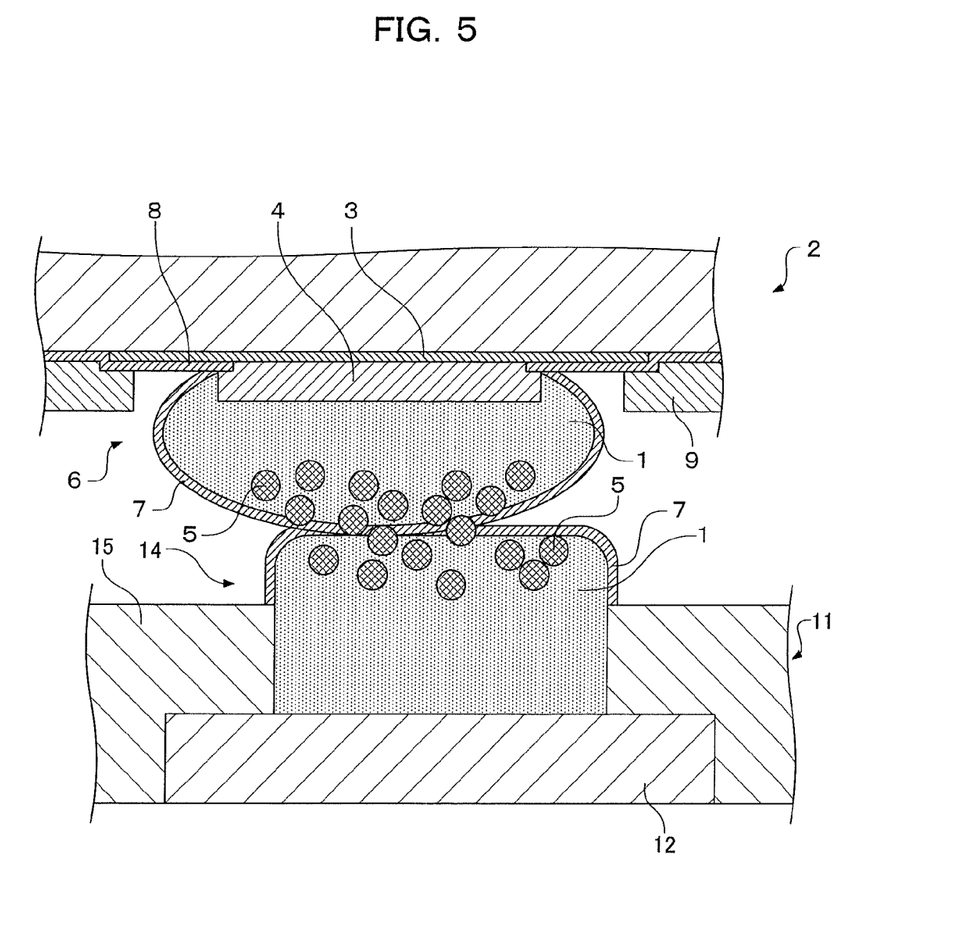
FIG. 5 is a sectional view showing the conductive connection structure during the application of ultrasonic waves according to the first embodiment of the present invention.

Next, the suction tool on the side of the semiconductor chip 2 was increased in temperature and the solder 1 was heated for five seconds at 260° C., which was not lower than the melting point of the solder 1, to melt the solder 1 of the solder bump 6 and the solder 1 of the SOP 14. Ordinarily, the oxide film 7 of several nm is formed on the surface of the solder 1 and thus the solder bump 6 and the SOP 14 are not joined to each other only by pressing the molten solder 1. Thus, as shown in FIG. 5, the substrate 11 is horizontally vibrated at 10 Hz by a width of 20 μm for five seconds (for example, the substrate 11 is vibrated by applying ultrasonic waves) and the oxide films 7 of the solder 1 are rubbed together in a state in which the semiconductor chip 2 is disposed above the substrate 11, so that the oxide films 7 are broken. According to the present embodiment, the filler 5 is segregated around the contact point of the solder bump 6 and the SOP 14, and the filler 5 remaining solid even during the melting of the solder 1 effectively acts upon the breaking of the oxide films 7. In the present embodiment, the porous filler 5 is used. By using the porous filter 5 thus, the oxide films 7 can be more satisfactorily broken with enhanced effect.

Figure 6:
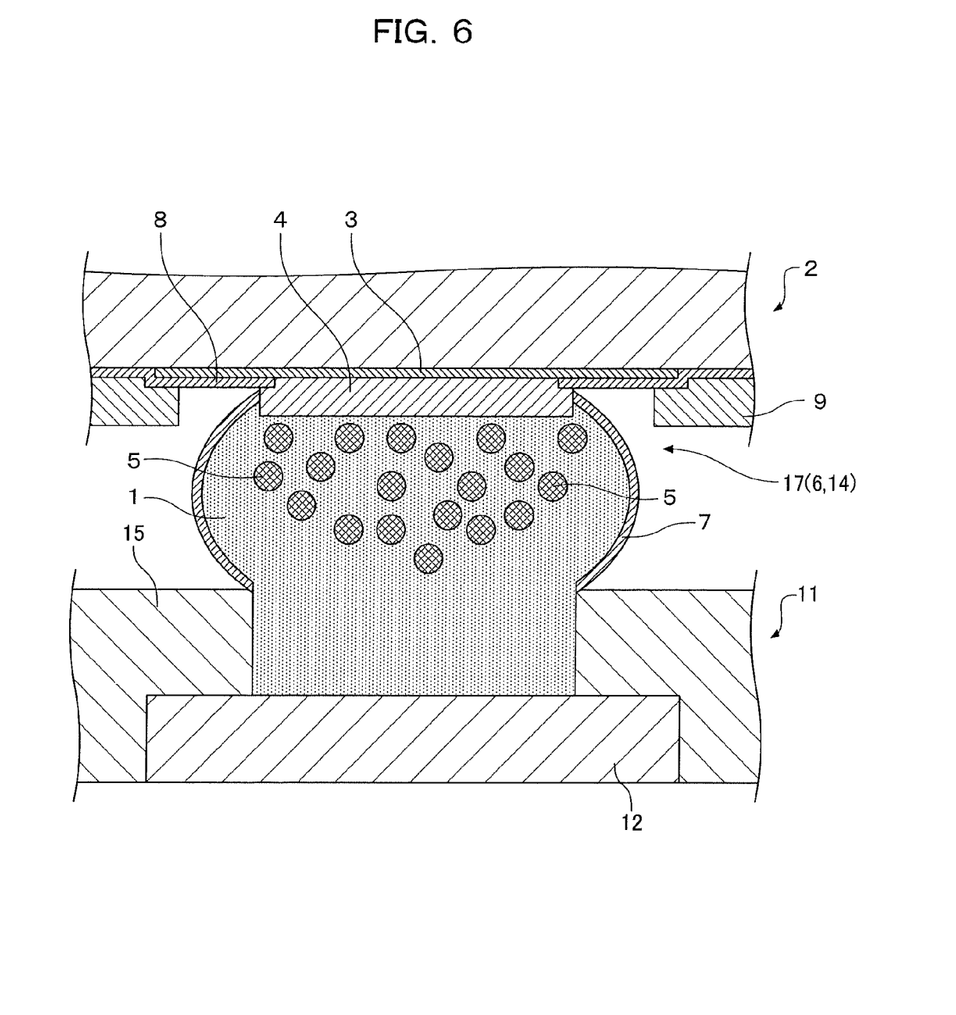
FIG. 6 is a sectional view showing the conductive connection structure after oxide films are broken according to the first embodiment of the present invention.

Next, as shown in FIG. 6, the oxide films 7 are broken from around the junction point of the solder bump 6 and the SOP 14. As the joining of the solder bump 6 and the SOP 14 proceeds, the filler 5 having a lower specific gravity than the solder 1 starts floating up to the upper layer. Finally, as shown in FIG. 1, the filler 5 is segregated with a volume ratio of 20% to 50% in the solder 1 on the side of the connection electrode 3 of the semiconductor chip 2 (to be specific, at 5 μm near the UBM 4 of the semiconductor chip 2) in the solder joint 17 formed by bonding the solder bump 6 and the SOP 14.

At this point, the linear expansion coefficient of nickel of the UBM 4 in contact with the solder joint 17 and the linear expansion coefficient of SiN of the passivation film 8 are both $14 \times 10^{-6}/°$ C. In the solder joint 17, when the filler 5 is segregated with a volume ratio of about 37% in the solder 1 near the UBM 4, the linear expansion coefficients of the UBM 4 and the passivation film 8 are substantially equal to the apparent linear expansion coefficient of the solder 1 containing the filler 5, so that a stress near the connection electrode 3 of the semiconductor chip 2 can be considerably reduced.

The optimum content of the filler 5 near the connection electrode 3 (UBM 4) of the solder joint 17 varies with combinations of the solder 1 and the filler 5. For example, relative to the solder 1 of Sn-3Ag-0.5Cu, the optimum content of the filler 5 is about 45% in the case of silicon carbide and is about 42% in the case of silicon nitride. Thus it is preferable that the filler 5 is segregated with a volume ratio of 35% to 50%.

When the content of the filler 5 is much smaller than the optimum value, a difference between the apparent linear expansion coefficient of the solder 1 containing the filler 5 and the linear expansion coefficients of the UBM 4 and the passivation film 8 is not reduced, so that the effect of reducing a stress declines. When the content of the filler 5 exceeds a volume ratio of 50%, a connection resistance increases between the connection electrode 3 of the semiconductor chip 2 and the substrate electrode 12, so that it is difficult to satisfy electrical characteristics.

After that, the suction tool on the side of the semiconductor chip 2 is cooled to 200° C., so that the solder 1 of the solder joint 17 is solidified to form the conductive connection structure 16. Next, an underfill material is applied into a gap between the semiconductor chip 2 and the substrate 11 and is cured therein, so that a mounting structure is completed.

With this configuration, the filler 5 having a small extension/shrinkage (that is, a thermal expansion coefficient) relative to a temperature change is segregated near the UBM 4 of the semiconductor chip 2 in the solder joint 17, so that an extension/shrinkage decreases relative to a temperature change. Therefore, in the cooling solidification of the solder, the shrinkage of the solder bump 6 near the connection electrode 3 of the semiconductor chip 2 is reduced by the filler 5 and the occurrence of a stress caused by the shrinkage is also reduced. Thus it is possible to prevent the occurrence of cracks near a joint with the connection electrode 3 of the semiconductor chip 2 in the solder joint 17. Consequently, it is possible to improve the reliability of the conductive connection structure 16.

(Second Embodiment)

Figure 7:
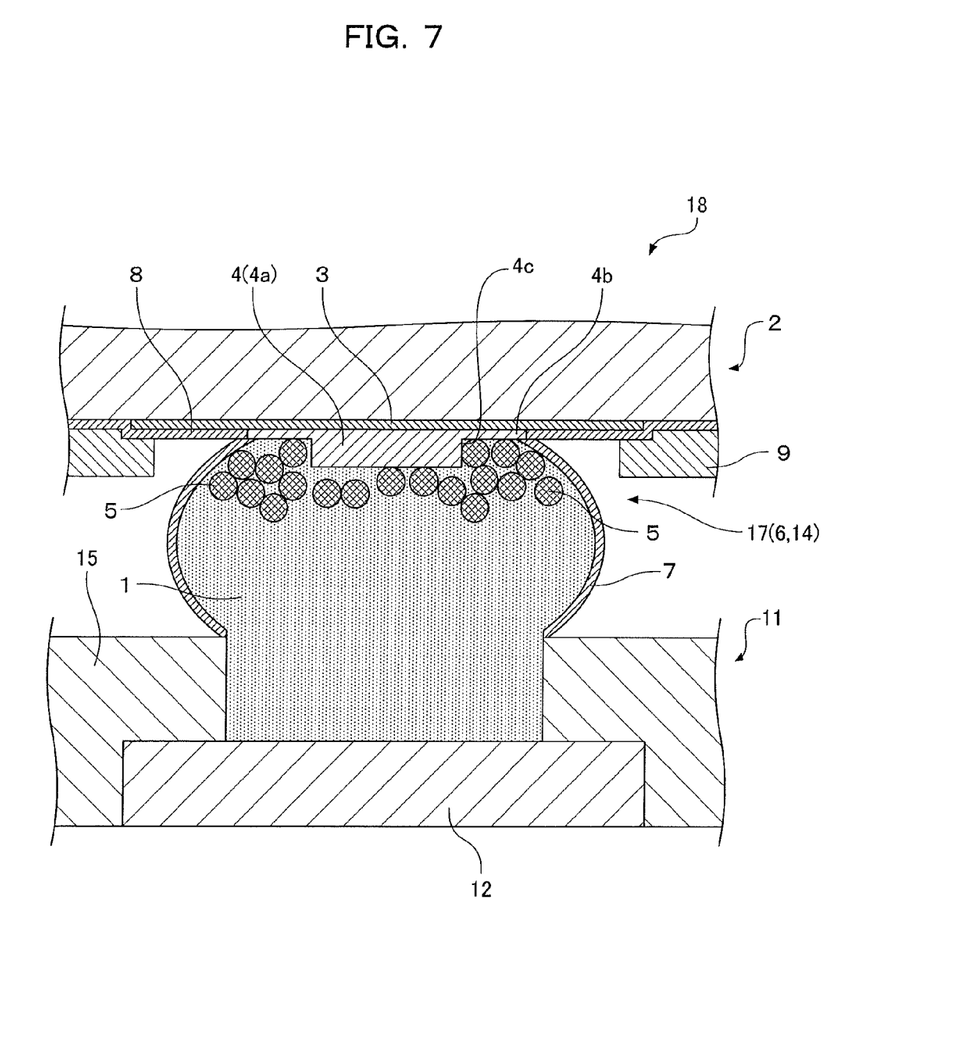
FIG. 7 is a sectional view showing a conductive connection structure according to a second embodiment of the present invention (after the cooling of solder)
Figure 8:
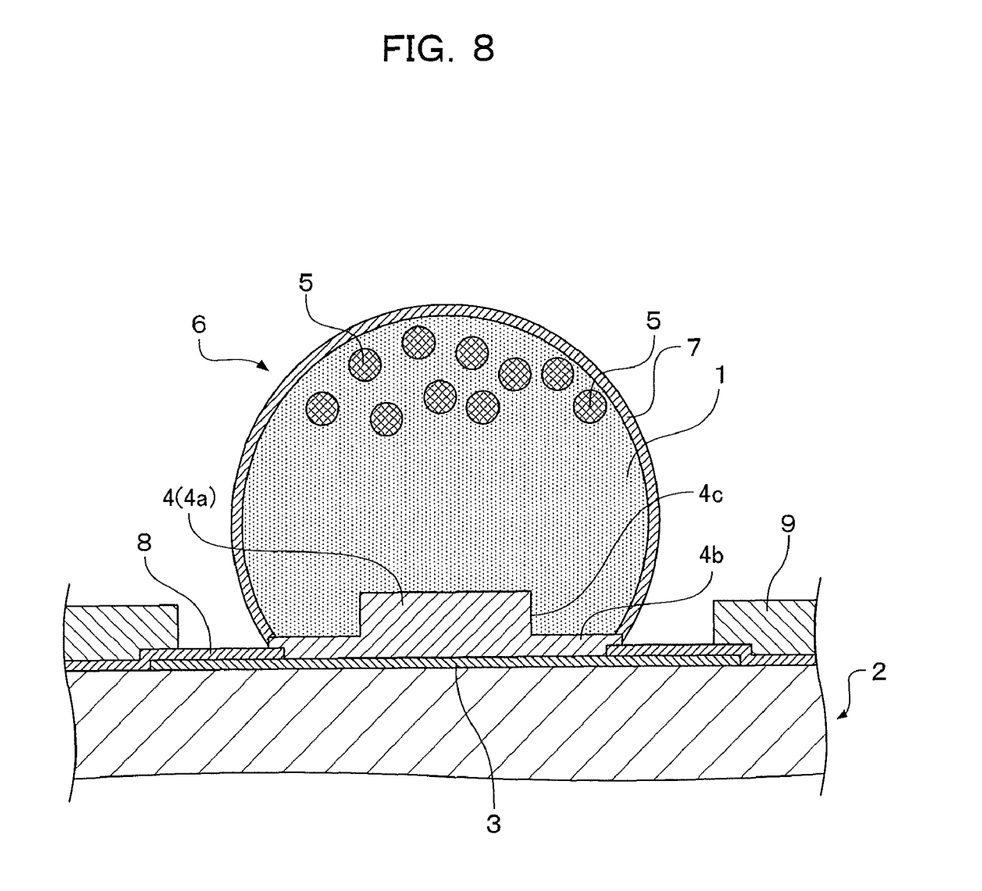
FIG. 8 is a sectional view showing a semiconductor chip on which a solder bump containing filler is formed according to the second embodiment of the present invention.

FIGS. 7 and 8 are sectional views showing a solder joint 17, a solder bump 6, and so on according to a second embodiment of the present invention. FIG. 7 is the sectional view showing the solder joint 17 and so on in a state in which a conductive connection structure 16 is formed. FIG. 8 is the sectional view showing the solder bump 6 in a state in which the solder bump 6 is formed on a semiconductor chip 2 before joining to a substrate 11. In FIGS. 7 and 8, the same constituent elements as in the first embodiment are indicated by the same reference numerals and the explanation thereof is omitted.

As shown in FIGS. 7 and 8, the second embodiment is different from the first embodiment in that a UBM 4 composed mainly of nickel is shaped like a convex portion having a step portion 4c on a connection electrode 3 of the semiconductor chip 2. In this configuration, the shape and forming method of the UBM 4 are not limited as long as a height difference is made between a central portion 4a and a peripheral portion 4b (the central portion 4a is high and the peripheral portion 4b is low) and the UBM 4 has the step portion 4c. For example, a method of forming a step with a height difference by performing electrolytic plating several times is also available. In the present embodiment, as shown in FIG. 8, the aluminum connection electrode 3 was plated with electrolytic nickel with a diameter of 60 μm and a thickness of 1 μm, and then the connection electrode 3 was plated for the second time with a diameter of 40 μm and a thickness of 3 μm, so that the UBM 4 having the step portion 4c was formed.

After that, through the same process as in the first embodiment, the solder bump 6 was formed, a SOP 14 was formed, and the semiconductor chip 2 and the substrate 11 were connected to each other, so that a conductive connection structure 18 of FIG. 7 was formed.

With this configuration, as shown in FIG. 7, filler 5 is segregated intensively on the step portion 4c formed on the peripheral portion of the connection electrode 3 (the peripheral portion 4b of the UBM 4 in the present embodiment) of the semiconductor chip 2, the peripheral portion having the highest stress concentration. Thus it is possible to more effectively reduce a stress near the connection electrode 3 of the semiconductor chip 2. Consequently, it is possible to more reliably prevent the occurrence of cracks and suppress the filler 5 gathering around the central portion 4a widely coming into flat contact with the solder joint 17, thereby suppressing a connection resistance increased by the contained filler 5.

Figure 9:
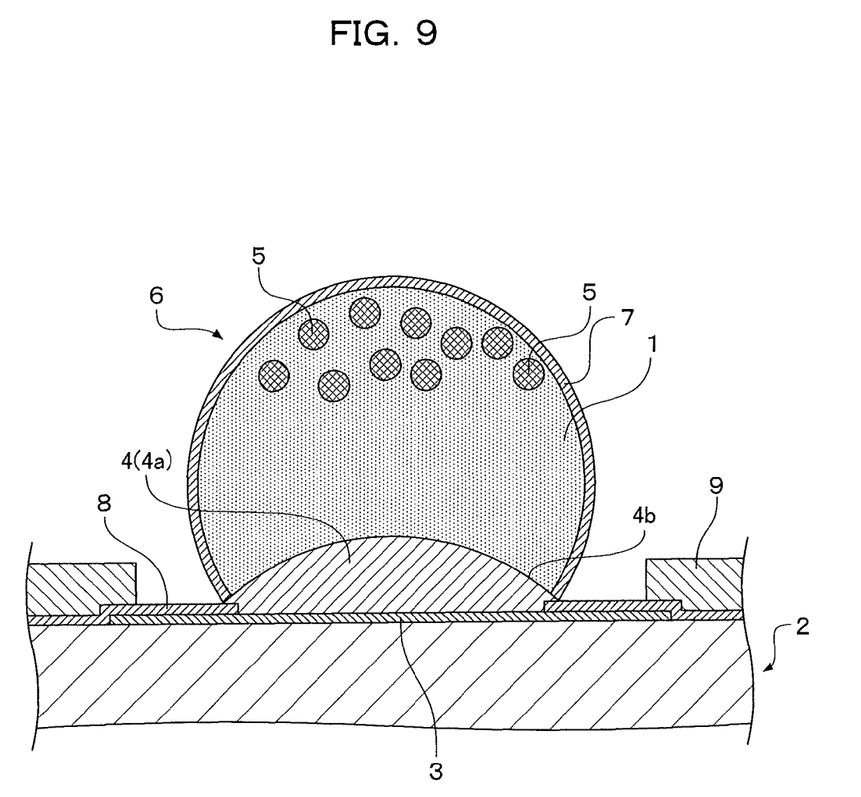
FIG. 9 is a sectional view showing a conductive connection structure according to a third embodiment of the present invention (after the cooling of solder)
Figure 10:
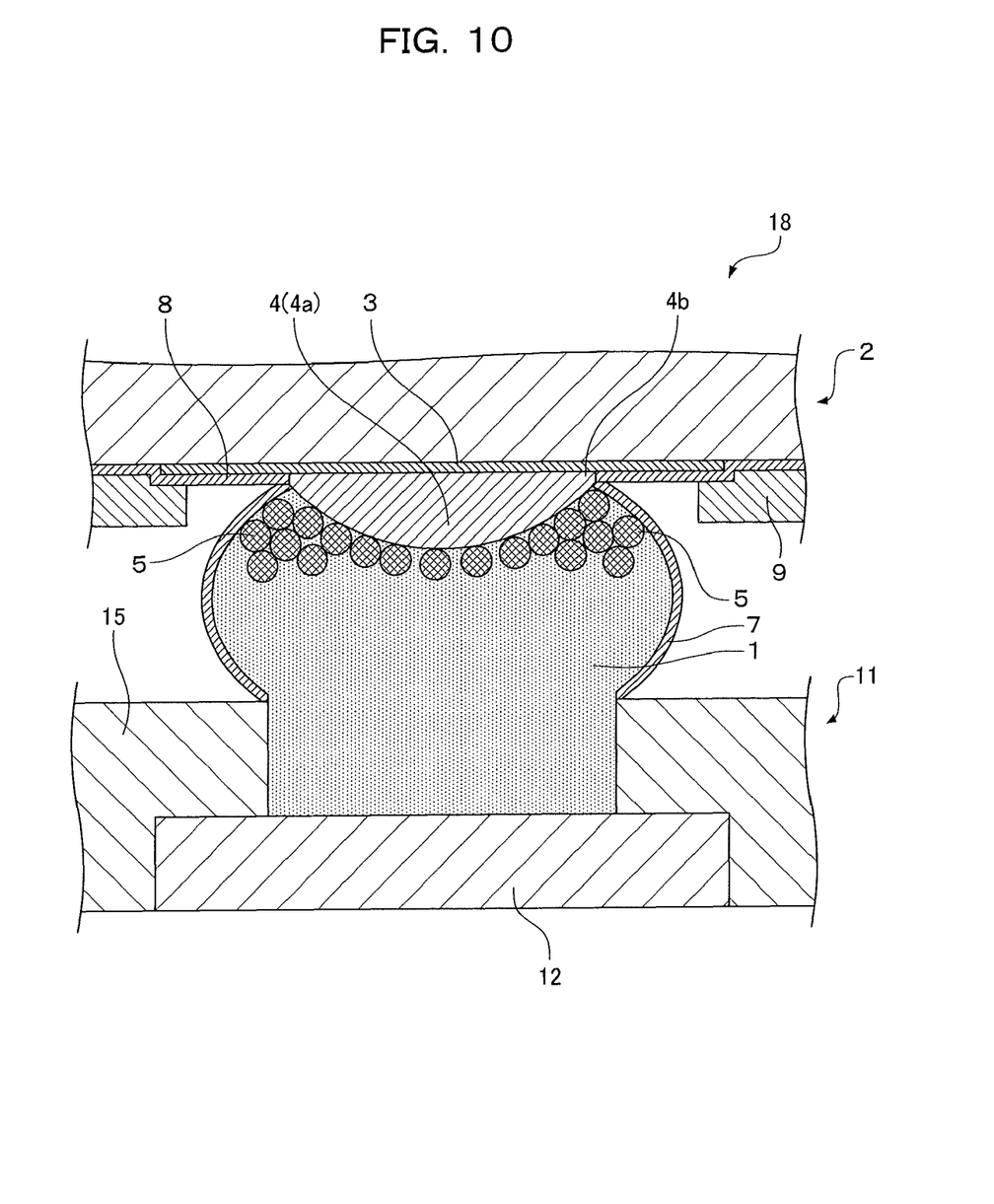
FIG. 10 is a sectional view showing a semiconductor chip on which a solder bump containing filler is formed according to the third embodiment of the present invention.

As previously mentioned, by forming the step portion 4c on the UBM 4, the filler 5 can be segregated intensively near the step 4c and the peripheral portion 4b of the UBM 4 in quite a satisfactory manner and the occurrence of cracks can be prevented with reliability. The configuration is not particularly limited. In other words, as shown in FIG. 9, the UBM 4 may be formed with a high aspect by electroless plating such that a height difference is made by the curve of the peripheral portion. Also with this configuration, as shown in FIG. 10, the filler 5 can be segregated intensively near the peripheral portion 4b of the UBM 4 and the occurrence of cracks can be prevented with reliability. Simultaneously, it is possible to suppress a connection resistance increased by the contained filler 5.

The solder bump, the semiconductor chip, the method of manufacturing the semiconductor chip, the conductive connection structure, and the method of forming the conductive connection structure of the present invention are applicable to various conductive connection structures which connect semiconductor chips and substrates via solder bumps.

What is claimed is:

1. A solder bump provided on a connection electrode of a semiconductor chip to connect the connection electrode of the semiconductor chip and a substrate,
    wherein the solder bump contains filler having a lower thermal expansion coefficient than solder of the solder bump, and the filler has a higher density on an end of the solder bump than on a base of the solder bump.

2. The solder bump according to claim 1, wherein the filler has a porous surface.

3. The solder bump according to claim 1, wherein the filler has a linear expansion coefficient of $0.1 \times 10^{-6}/°$ C. to $11 \times 10^{-6}/°$ C. and a specific gravity of $1.0$ g/cm$^3$ to $6.0$ g/cm$^3$.

4. A semiconductor chip comprising the solder bump according to claim 1.

5. The semiconductor chip according to claim 4, wherein the solder bump is provided on the connection electrode of the semiconductor chip via an under bump metal, the under bump metal has a step formed thereon, and the base of the solder bump is provided so as to contain the step.

6. A method of manufacturing the semiconductor chip according to claim 4, comprising the steps of:
    forming the solder bump containing the filler on the semiconductor chip; and
    melting the solder containing the filler,
    wherein in the melting step, the semiconductor chip is vibrated to segregate the filler in the solder bump in a state in which the solder bump is disposed on the semiconductor chip.

7. A conductive connection structure comprising a solder joint formed by joining a solder bump provided on a connection electrode of a semiconductor chip and a solder portion provided on a substrate, the semiconductor chip being mounted on the substrate via the solder joint,
    wherein the solder joint contains filler having a lower thermal expansion coefficient than solder of the solder joint, and the filler has a larger density on a side of the connection electrode than on a side of the substrate in the solder joint.

8. The conductive connection structure according to claim 7, wherein the density of the filler is a volume ratio of 20% to 50% on the side of the connection electrode in the solder joint.

9. The conductive connection structure according to claim 7, wherein the density of the filler is a volume ratio of 35% to 50% on the side of the connection electrode in the solder joint.

10. The conductive connection structure according to claim 7, wherein the filler has a porous surface.

11. The conductive connection structure according to claim 7, wherein the filler has a linear expansion coefficient of $0.1 \times 10^{-6}/°$ C. to $11 \times 10^{-6}/°$ C. and a specific gravity of $1.0$ g/cm$^3$ to $6.0$ g/cm$^3$.

12. The conductive connection structure according to claim 7, wherein the solder joint is connected to the connection electrode of the semiconductor chip via an under bump metal, the under bump metal has a step formed thereon, and the solder joint has a portion connected to the under bump metal so as to contain the step.

13. A method of manufacturing the conductive connection structure according to claim 7, comprising the steps of:
    placing the semiconductor chip in contact with a predetermined position of the substrate; and
    melting the solder bump of the semiconductor chip,
    wherein in the melting step, one of the substrate and the semiconductor chip is vibrated in a state in which the semiconductor chip is disposed on the substrate, so that the filler is segregated in the solder bump to form the solder joint.

* * * * *